(12) United States Patent
Vashchenko et al.

(10) Patent No.: US 7,795,047 B1
(45) Date of Patent: Sep. 14, 2010

(54) CURRENT BALANCING IN NPN BJT AND BSCR SNAPBACK DEVICES

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 100 days.

(21) Appl. No.: 11/016,010

(22) Filed: Dec. 17, 2004

(51) Int. Cl.
H01L 31/072 (2006.01)

(52) U.S. Cl. .................... 438/14; 257/152; 257/163; 257/164

(58) Field of Classification Search ............ 257/577, 257/582, 197
See application file for complete search history.

(56) References Cited

U.S. PATENT DOCUMENTS

| | | | | |
|---|---|---|---|---|
| 4,266,236 A | * | 5/1981 | Ueda ............................ | 257/582 |
| 4,763,184 A | * | 8/1988 | Krieger et al. ............... | 257/362 |
| 5,378,922 A | * | 1/1995 | Sovero ........................ | 257/582 |
| 5,869,381 A | * | 2/1999 | Hebert et al. ............... | 438/330 |
| 5,969,929 A | * | 10/1999 | Kleveland et al. ........... | 361/111 |
| 6,130,471 A | * | 10/2000 | Boles .......................... | 257/577 |
| 6,225,867 B1 | * | 5/2001 | Ilowski et al. ................ | 330/298 |
| 6,472,286 B1 | * | 10/2002 | Yu .............................. | 438/342 |
| 6,583,972 B2 | * | 6/2003 | Verhaege et al. ............. | 361/56 |
| 6,686,801 B1 | * | 2/2004 | Cho et al. .................... | 330/295 |
| 6,707,341 B2 | * | 3/2004 | Yamamoto et al. .......... | 330/289 |
| 6,803,643 B2 | * | 10/2004 | Winslow ..................... | 257/197 |
| 6,891,230 B2 | * | 5/2005 | Yu .............................. | 257/361 |
| 7,023,029 B1 | * | 4/2006 | Vashchenko et al. ........ | 257/173 |
| 2004/0061131 A1 | * | 4/2004 | Winslow ..................... | 257/197 |
| 2005/0087813 A1 | * | 4/2005 | Lee et al. .................... | 257/378 |
| 2005/0151159 A1 | * | 7/2005 | Ma et al. ..................... | 257/152 |

OTHER PUBLICATIONS

S. M. Sze, Physics of Semiconductor Devices, second edition, pp. 169-175.*

* cited by examiner

*Primary Examiner*—Steven Loke
*Assistant Examiner*—David Goodwin
(74) *Attorney, Agent, or Firm*—Jurgen K. vollrath; Vollrath & Associates

(57) ABSTRACT

In a method and structure for current balancing the emitter current in a multi-finger n-emitter of a BJT or BSCR, back-end or polysilicon resistors are applied between the emitter fingers and the power rail, with the resistors chosen to be larger the closer the emitter fingers are to the collector.

3 Claims, 4 Drawing Sheets

CURRENT BALANCING IN NPN BJT AND BSCR SNAPBACK DEVICES

FIELD OF THE INVENTION

The invention deals with electrostatic discharge (ESD) device. In particular it deals with ESD clamps and self-protecting devices based on NPN BJT and BSCR structures for BiCMOS technology.

BACKGROUND OF THE INVENTION

The snapback characteristics of different NPN bipolar junction transistors (BJTs) and Bipolar SCRs (BSCRs) are particularly important when devices are used both as self-protecting as well as stand-alone devices.

While the collector in such devices can typically be large, emitter length is limited. Due to self-alignment considerations in bipolar technology, only a few emitter dimensions are supported. In the case of some technologies such as Si—Ge, only a single emitter length is, in fact, supported. The base contact region, which forms part of the self-aligned bipolar design, also faces size constraints. A typical BIT as known in the art is shown in FIG. 1, which shows an n-emitter 100 formed in a p-base 102, which is, in turn, formed in a n-type collector 104. The emitter 100 is contacted through an emitter poly layer 110, while the base 102 is contacted directly by a base contact 112, which contacts a silicide layer (not shown) on the base 102. The collector 104 under the base 102 is contacted via a buried layer 106 and a Sinker 108 as known in the art. The sinker 108 is contacted by a sinker contact 116, which is spaced from the emitter poly 110 by an oxide layer 118. Thus the vertical configuration of the BIT is achieved by providing the sinker 108 that extends vertically, and the horizontally extending buried layer 106.

The size limitations of the emitter 100 limit its current carrying capacity and therefore create problems in using the device in high current ESD applications. In practice this issue is addressed by making use of multi-emitter BIT and BSCR devices to support the high ESD currents. For purposes of this application the term multi-emitter covers individual emitters that are connected together as well as an emitter with multiple emitter fingers. The individual elements of the emitter, whether individual emitters or emitter fingers of a single emitter, will be referred to as emitter fingers for convenience. Different snapback bipolar and BSCR configurations have therefore been implemented by placing multiple bases and emitters between collectors, e.g., C-B-E, C-B-E-B-C, C-B-E-B-E-B-C, C-B-E-B-E-B-B-E-B-E-B-C, etc., or around a collector, e.g., B-E-C-E-B. One such configuration is shown in FIG. 2, which shows a cross section through a multi-finger emitter BJT with emitter fingers 200, 202, 204, 206, 208, and multiple base contacts 210, 212, 214, 216. In FIG. 2, only one collector contact 220 is shown on the right hand side, but the multiple emitter fingers and base contacts could also be formed between a pair of collector contacts with another collector contact formed on the left hand side.

While multiple emitter fingers and multiple base contacts seek to address the current density concerns during ESD events, test results indicate that the use of multiple emitters or multiple bases results in non-uniform current distribution at high current densities. As a result, for ESD operation, which involves high current densities, the devices will not perform optimally. Typically proper current distribution is only observed under normal operating conditions as opposed to the operation during ESD events. This can be ascribed to the fact that the overall ESD operation depends on the sub-collector design, which is typically designed to provide proper current distribution during normal operation as opposed to during ESD operation.

SUMMARY OF THE INVENTION

The invention seeks to balance the current in multi-emitter NPN BJT and NPN BSCR devices by implementing a back-end or poly-resistor structure to define interconnect resistors between emitter fingers and a power rail. Preferably the resistance of the interconnect resistors varies with distance from the collector. For instance, the closer the emitter finger is to the collector the larger the resistance. Preferably the resistor values are between 0.02 and 0.5 Ohms. To form these resistors, the emitter regions can be extended to define poly-resistors or backend regions can be used to create the resistors. In the latter case, the resistors can be made from poly or metal interconnect layers or metal vias.

Further, according to the invention, there is provided a method of balancing base current in multiple base contact snapback BJTs and BSCRs, by providing different base resistors for the various base contacts using interconnect or back-end regions or polysilicon material. In the case of back-end or interconnect resistors the resistors may be formed from metal interconnect layers or from metal vias. In the case of resistors formed from polysilicon regions the resistors may be formed by extending the polysilicon of the base poly regions. Typically the resistor values decrease as the emitter-collector distance increases.

DETAILED DESCRIPTION OF THE INVENTION

Figure 1:
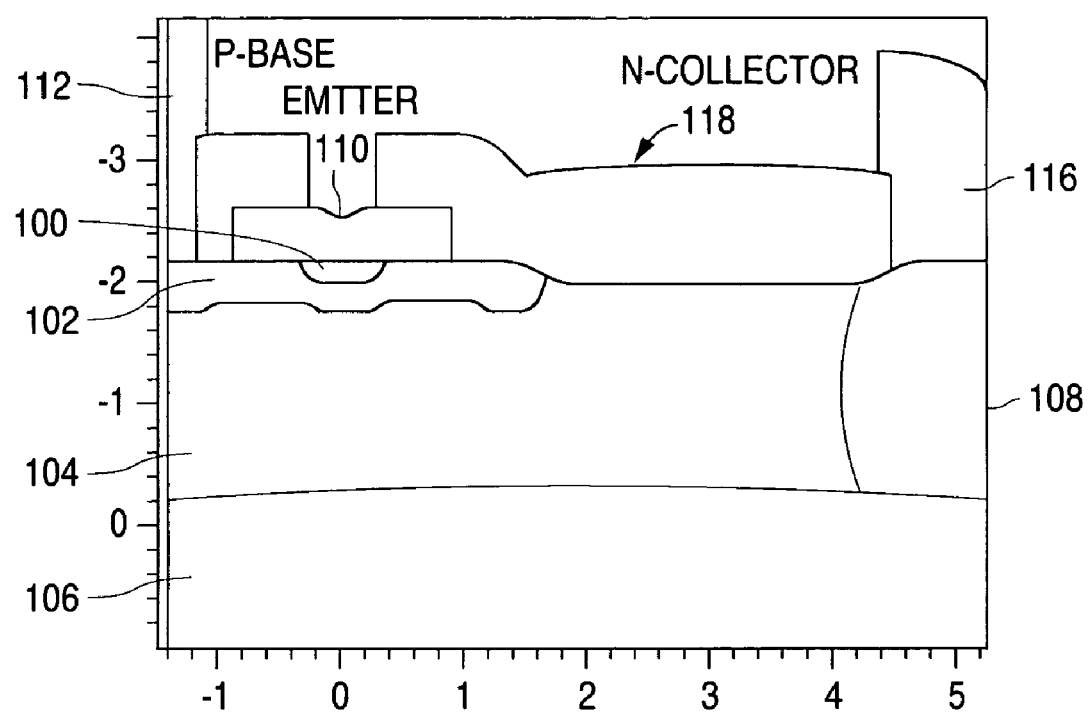
FIG. 1 is a sectional view through a typical NPN BJT as known in the art.
Figure 2:
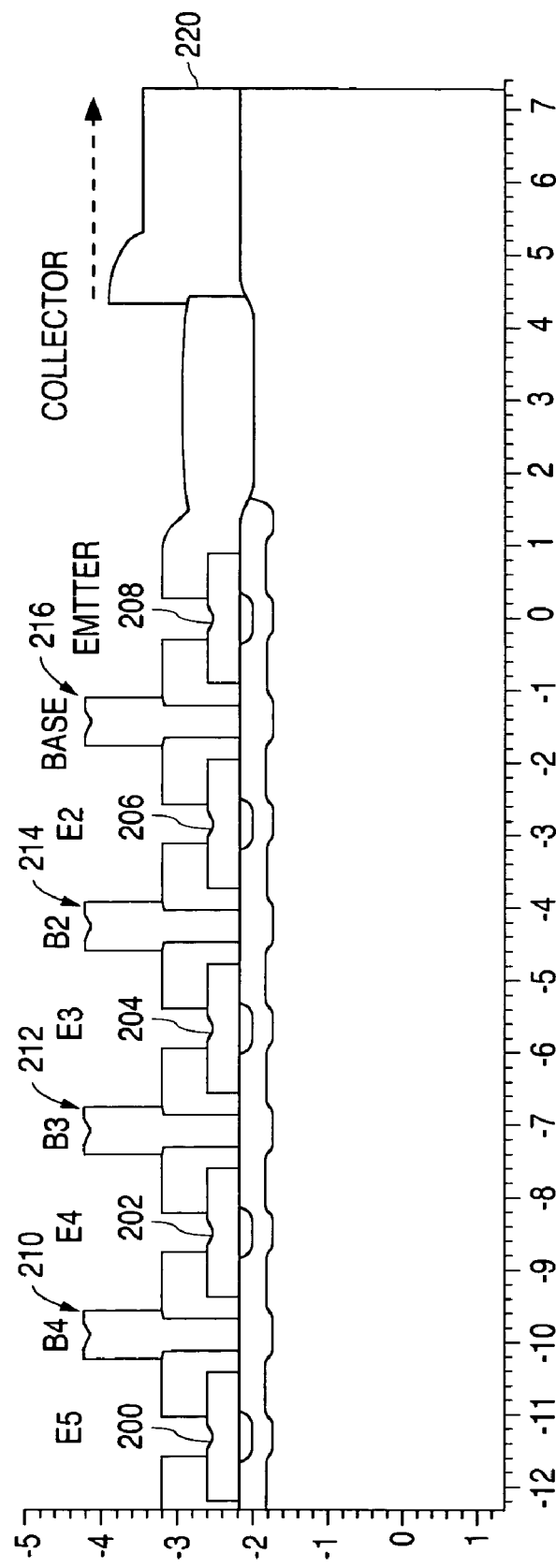
FIG. 2 is a sectional view through a BJT with multiple emitter fingers and multiple base contacts as known in the art.
Figure 3:
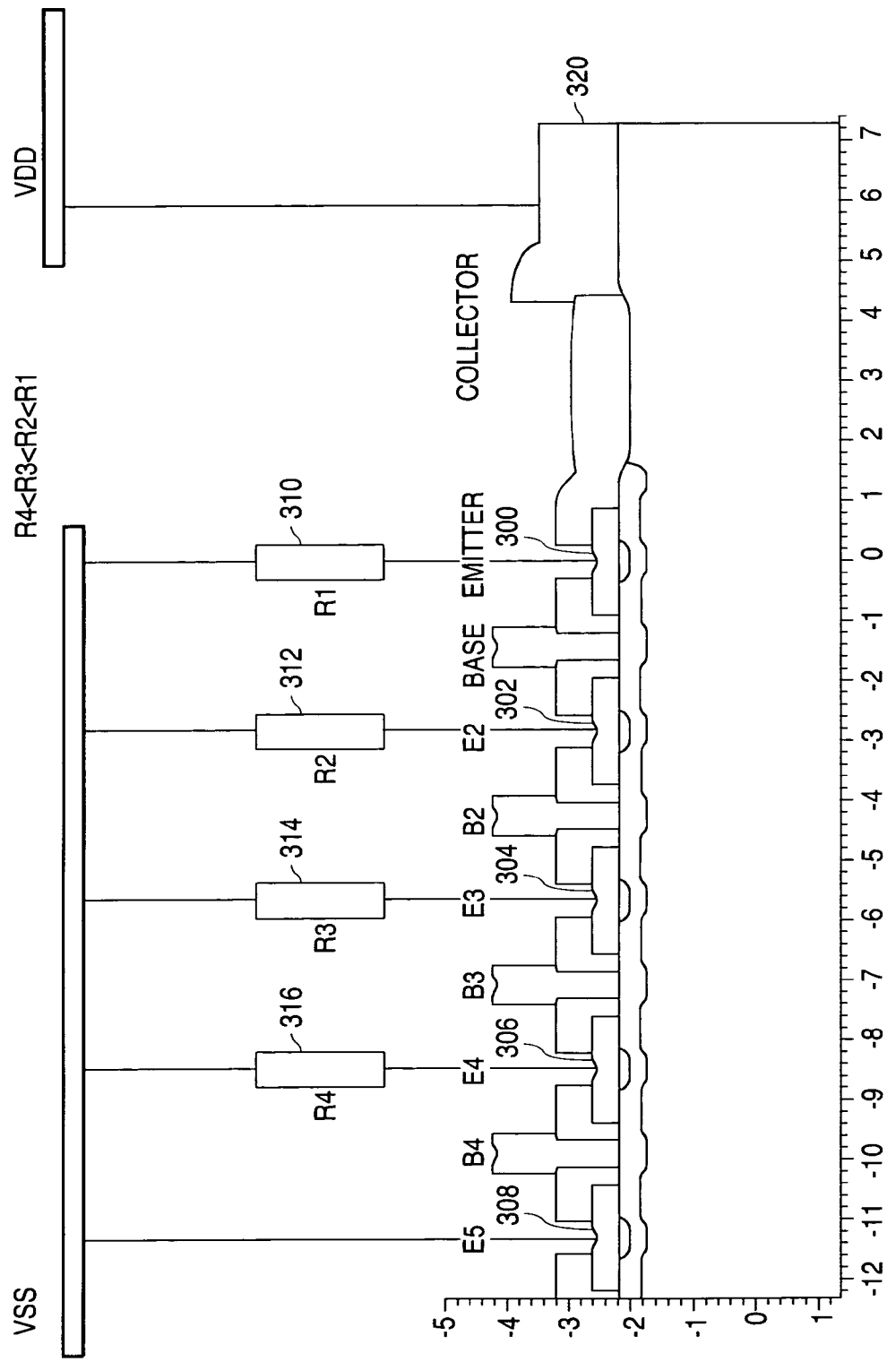
FIG. 3 is a sectional view through a BJT with multiple emitter fingers and multiple base contacts and with emitter resistors in accordance with one embodiment of the invention, and b

FIG. 3 shows one embodiment of the invention, in which interconnect resistors are provided for the emitter fingers. The embodiment of FIG. 3 shows a BJT configuration with multiple emitter fingers and multiple base contacts similar to the BJT of FIG. 2, however, in accordance with one aspect of the invention, the emitter finger 300, closest to the collector 320, is provided with interconnect resistor 310. Emitter finger 302 is provided with an interconnect resistor 312; emitter finger 304 is provided with an interconnect resistor 314; emitter finger 306 is provided with interconnect resistor 316, and emitter finger 308 is connected directly to Vss without a resistor. As the distance between the collector and the emitter fingers increases, the corresponding resistor values are reduced until the last emitter 308 is provided with no additional resistor. Since the resistance to current flow between the emitters and the collector (emitter-collector resistance) can be plotted against distance from the collector, the appropriate interconnect resistance values can be determined to ensure balanced current distribution across all emitter fingers, i.e., the closer the emitter finger is to the collector the lower the emitter-collector resistance through the structure, and the higher the additional interconnect resistor has to be. In this embodiment the collector is connected to Vdd while the emitters are connected to Vss. It will, however, be appreciated that the emitters and collector can, in different embodiments, be connected to different power levels, e.g., by being connected through one or more additional resistors.

Figure 4:
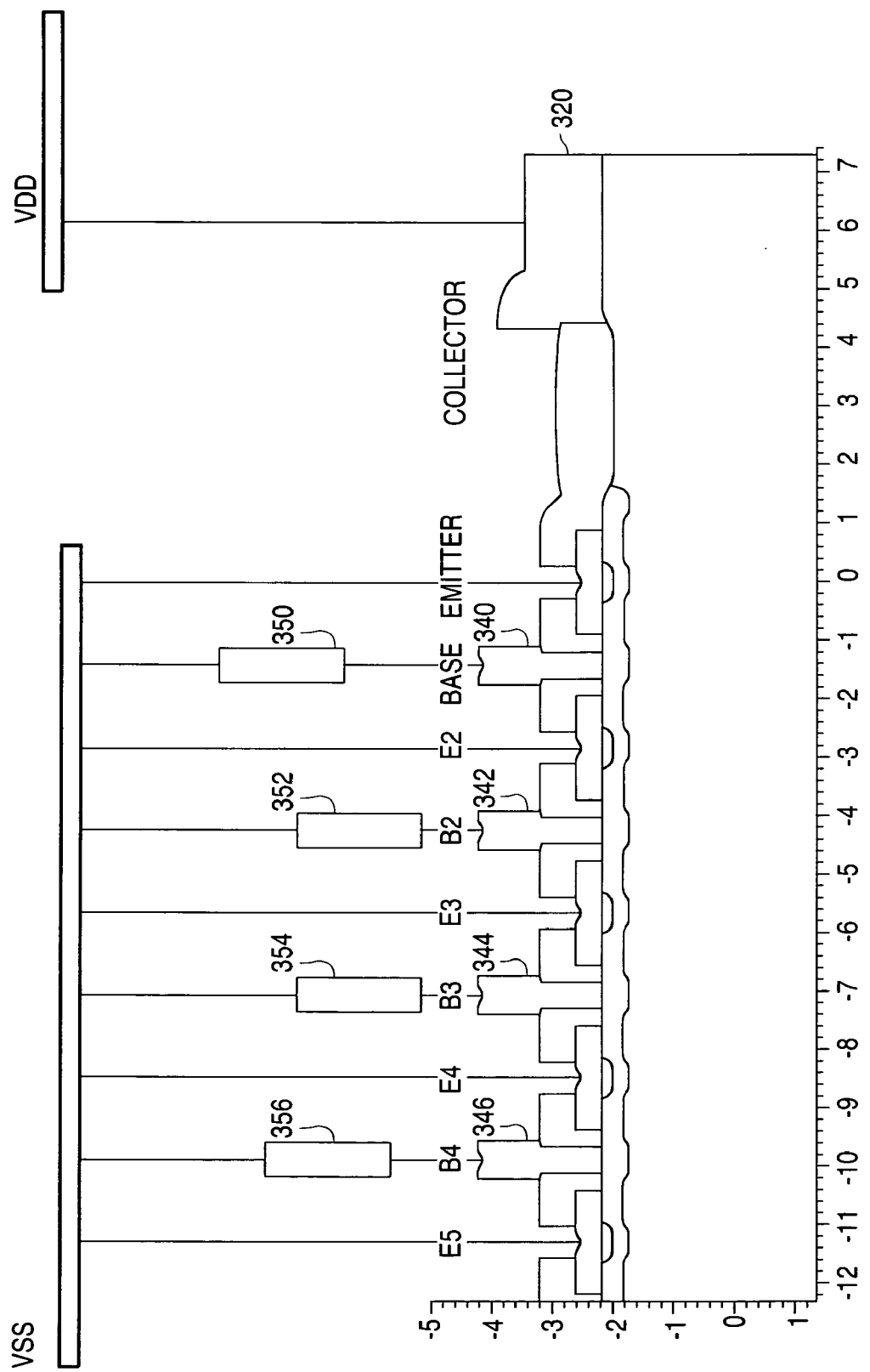
FIG. 4 is a sectional view through a BJT with multiple emitter fingers and multiple base contacts with base contact resistors in accordance with another embodiment of the invention.

In another embodiment, shown in FIG. 4, the bases 340, 342, 344, 346 were connected to Vss through interconnect resistors 350, 352, 354, 356. The resistors were again chosen based on the distance between the emitters and the collector. For ease of discussion the same BJT configuration was used as in FIG. 3 and like elements in FIG. 4 were given like reference numerals. By providing the bases with decreasing interconnect resistors as the emitter-collector distance increases allows the various portions of the transistor with its plurality of emitter fingers, to be turned on substantially simultaneously. In this embodiment even the base associated with the furthest emitter is provided with a resistor (resistor 356) for ease of manipulating the base currents. It will be noted that the embodiment of FIG. 4 does not provide a one-to-one correspondence between emitter fingers and base contacts. Other embodiments can be devised. For instance, there could be a one-to-one correspondence between emitter fingers and bases. Also there could be resistors for both the emitters and the bases.

While the resistors described in the two embodiments of FIGS. 3 and 4 were interconnect resistors (i.e., made from metal interconnect layers or metal vias) they could also be formed as part of extended emitter regions (i.e., from the emitter polysilicon material) or extended base regions (i.e., from the base poly). Also, while a specific configuration was shown for the emitter fingers it will be appreciated that this does not in any way limit the shape, configuration or positioning of the emitter portions. Also, as mentioned above, individual emitters that are connected together could be used instead.

What is claimed is:

1. A method of balancing base current in snapback BJTs and BSCRs that include a collector, comprising
    providing the BJT or BSCR with multiple base contacts,
    providing different base resistors for the various base contacts the base resistors being chosen to have decreasing resistance values with increasing distance from the collector of the BJT or BSCR using back-end regions or polysilicon material.

2. A method of claim 1, wherein in the case of base resistors made from back-end regions the resistors are formed from metal interconnect layers or from metal vias.

3. A method of claim 1, wherein the base contacts are formed from polysilicon and, in the case of resistors formed from polysilicon material the resistors are formed by extending the polysilicon of the base contacts.

* * * * *